(12) United States Patent
Nishiyama et al.

(10) Patent No.: US 7,298,644 B2
(45) Date of Patent: Nov. 20, 2007

(54) MAGNETORESISTANCE EFFECT DEVICE HAVING CRYSTAL GRAIN BOUNDARY AND METHOD OF MANUFACTURING THE SAME

(75) Inventors: Katsuya Nishiyama, Yokohama (JP); Toshihiko Nagase, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 246 days.

(21) Appl. No.: 11/234,237

(22) Filed: Sep. 26, 2005

(65) Prior Publication Data
US 2006/0119990 A1    Jun. 8, 2006

(30) Foreign Application Priority Data
Nov. 22, 2004    (JP)    ............................. 2004-337907

(51) Int. Cl.
*G11C 11/00*    (2006.01)

(52) U.S. Cl. .................. 365/158; 365/171; 365/173

(58) Field of Classification Search ................ 365/158, 365/171, 173; 360/324.11; 438/811.2–811; 457/421–422
See application file for complete search history.

(56) References Cited

U.S. PATENT DOCUMENTS
7,187,525 B2 * 3/2007 Shimura et al. ......... 360/324.2

FOREIGN PATENT DOCUMENTS
JP    2004-47583    2/2004

* cited by examiner

*Primary Examiner*—Son Dinh
*Assistant Examiner*—Hien N Nguyen
(74) *Attorney, Agent, or Firm*—Oblon, Spivak, McClelland, Maier & Neustedt, P.C.

(57) ABSTRACT

A magnetoresistance effect device includes a magnetized free layer formed of a ferromagnetic material, a magnetized fixing layer formed of a ferromagnetic material and having a crystal grain boundary, a nonmagnetic layer provided between the magnetized free layer and the magnetized fixing layer, and an antiferromagnetic layer provided on one surface of the magnetized fixing layer, which is opposed to a surface of the nonmagnetic layer. The magnetized fixing layer has an element which is segregated into the crystal grain boundary to prevent a material of the antiferromagnetic layer from diffusing.

23 Claims, 10 Drawing Sheets

(L1>L3>L5,L7    L2>L4>L6,L8)

MAGNETORESISTANCE EFFECT DEVICE HAVING CRYSTAL GRAIN BOUNDARY AND METHOD OF MANUFACTURING THE SAME

CROSS-REFERENCE TO RELATED APPLICATIONS

This application is based upon and claims the benefit of priority from prior Japanese Patent Application No. 2004-337907, filed Nov. 22, 2004, the entire contents of which are incorporated herein by reference.

BACKGROUND OF THE INVENTION

1. Field of the Invention

The present invention relates to a magnetoresistance effect device and a method of manufacturing the device, which are applied to a magnetic random access memory (MRAM) and the like.

2. Description of the Related Art

Attention has recently been attracted to a magnetic random access memory (referred to as MRAM hereinafter), which makes use of magnetoresistance effects of a ferromagnet, as a next-generation solid-state nonvolatile memory capable of reading/writing data at high speed, having a large capacity and performing a low power operation. In particular, a magnetoresistance effect device with a ferromagnetic tunnel junction has been noted more and more since it was found that the device greatly varied in magnetoresistance.

The ferromagnetic tunnel junction has a laminated structure of three layers as a basic structure. The three layers are a free layer (magnetized free layer) whose magnetization direction easily varies with an external magnetic field, a pin layer (magnetized fixing layer) which is opposed to the free layer and maintained in a given magnetization direction even though an external magnetic field is applied, and a tunnel barrier layer (insulator layer) which is interposed between the free layer and the pin layer. The pin layer is formed by stacking an antiferromagnetic layer on a ferromagnetic layer and its magnetization direction is fixed. The free layer is generally formed of soft magnetic material whose coercive force is small. In the ferromagnetic tunnel junction, current flows through the tunnel barrier layer used as a tunnel. The resistance of the junction varies with a relative angle between the pin layer and the free layer in the magnetization direction. The resistance is minimized when the magnetization directions of the pin and free layers are parallel and maximized when they are not parallel. This variation in resistance is called a tunneling magneto-resistance effect (referred to as TMR effect hereinafter). When a magnetic device having a ferromagnetic tunnel junction is actually used as one storage cell of an MRAM, it stores information by making the parallel and not parallel states (minimum and maximum of resistance) between the pin layer and the free layer correspond to "0" and "1".

The write of magnetic information is performed by arranging a write interconnection close to the storage cell and inverting only the magnetization direction of the free layer by a current magnetic field generated when current flows through the storage cell. The read of magnetic information is performed by detecting a variation in resistance due to the TMR effect when sense current flows through the storage cell. The above-described magnetoresistance effect device using the TMR effect is called a magnetic tunnel junction (MTJ) device.

In order to put an MRAM having an MTJ device to practical use as a device, an antiferromagnetic layer, a pin layer and the like are subjected to crystal growth and need to have heat resistance so that the output characteristics (variations of resistance of tunnel junction: MR ratio) do not deteriorate even after heat treatment at about 350° C. that is required in a semiconductor process.

If, however, a generally-used antiferromagnet is heat-treated at about 350° C. in terms of heat stability in a so-called spin bulb type MTJ device, the material of an antiferromagnetic layer diffuses to the interface between a pin layer and a tunnel barrier layer provided on the antiferromagnetic layer to decrease the spin polarizability of a ferromagnet used for the pin layer. Thus, the output characteristics (MR ratio) deteriorate.

Even though the same heat treatment is performed in an MTJ device having a pin layer of a synthetic pin type, the material of an antiferromagnetic layer diffuses to destroy the interface between a ferromagnetic layer and a nonmagnetic layer in the pin layer. Antiferromagnetic coupling is weakened and the pin layer is made unstable in its magnetization direction. Accordingly, the output characteristics (MR ratio) deteriorate.

The material of an antiferromagnetic layer diffuses not only in an interface but also along a crystal grain boundary. In general, the diffusion along the crystal grain boundary is caused more easily than that in the interface (see, for example, FIG. 7 in Jpn. Pat. Appln. KOKAI Publication No. 2004-47583).

BRIEF SUMMARY OF THE INVENTION

According to a first aspect of the present invention, there is provided a magnetoresistance effect device comprising a magnetized free layer formed of a ferromagnetic material, a magnetization of the magnetized free layer being variable, a magnetized fixing layer formed of a ferromagnetic material and having a crystal grain boundary, a magnetization of the magnetized fixing layer being fixed, a nonmagnetic layer provided between the magnetized free layer and the magnetized fixing layer, and an antiferromagnetic layer provided on the opposite side of the magnetized fixing layer from the nonmagnetic layer, wherein the magnetized fixing layer has an element which is segregated into the crystal grain boundary thereof to prevent a material of the antiferromagnetic layer from diffusing.

According to a second aspect of the present invention, there is provided a magnetoresistance effect device comprising a magnetized free layer formed of a ferromagnetic material, a magnetization of the magnetized free layer being variable, a synthetic pinned layer, a magnetization of the magnetized pinned layer being pinned, a first nonmagnetic layer provided between the magnetized free layer and the synthetic pinned layer, and an antiferromagnetic layer provided on the opposite side of the synthetic pinned layer from the first nonmagnetic layer, wherein the synthetic pinned layer includes a first NiFe layer having an element which is segregated into a crystal grain boundary to prevent a material of the antiferromagnetic layer from diffusing.

According to a third aspect of the present invention, there is provided a magnetoresistance effect device comprising a magnetized free layer formed of a ferromagnetic material, a magnetization of the magnetized free layer being variable, a magnetized fixing layer formed of a ferromagnetic material and having a crystal grain boundary, at least one of Ca, Ti, V, Sr, Y, Zr, Nb, Ba, La, Hf and Ta being segregated into the crystal grain boundary, a nonmagnetic layer provided between the magnetized free layer and the magnetized fixing layer, and an antiferromagnetic layer provided on the opposite side of the magnetized fixing layer from the nonmagnetic layer.

According to a fourth aspect of the present invention, there is provided a method of manufacturing a magnetoresistance effect device, comprising forming a antiferromagnetic layer, forming a first ferromagnetic layer on the antiferromagnetic layer, an element being added to the first ferromagnetic layer to prevent a material of the antiferromagnetic layer from diffusing, heat-treating the antiferromagnetic layer and the first ferromagnetic layer to segregate the element into a crystal grain boundary in the first ferromagnetic layer, forming a nonmagnetic layer on the first ferromagnetic layer, and forming a second ferromagnetic layer on the nonmagnetic layer.

According to a fifth aspect of the present invention, there is provided a method of manufacturing a magnetoresistance effect device, comprising forming a first ferromagnetic layer, forming a nonmagnetic layer on the first ferromagnetic layer, forming a second ferromagnetic layer on the nonmagnetic layer, an element being added to the second ferromagnetic layer, forming an antiferromagnetic layer on the second ferromagnetic layer, the element preventing a material of the antiferromagnetic layer from diffusing, and heat-treating the first ferromagnetic layer, the nonmagnetic layer, the second ferromagnetic layer, and the antiferromagnetic layer to segregate the element into a crystal grain boundary in the second ferromagnetic layer.

DETAILED DESCRIPTION OF THE INVENTION

Figures 1A, 1B:
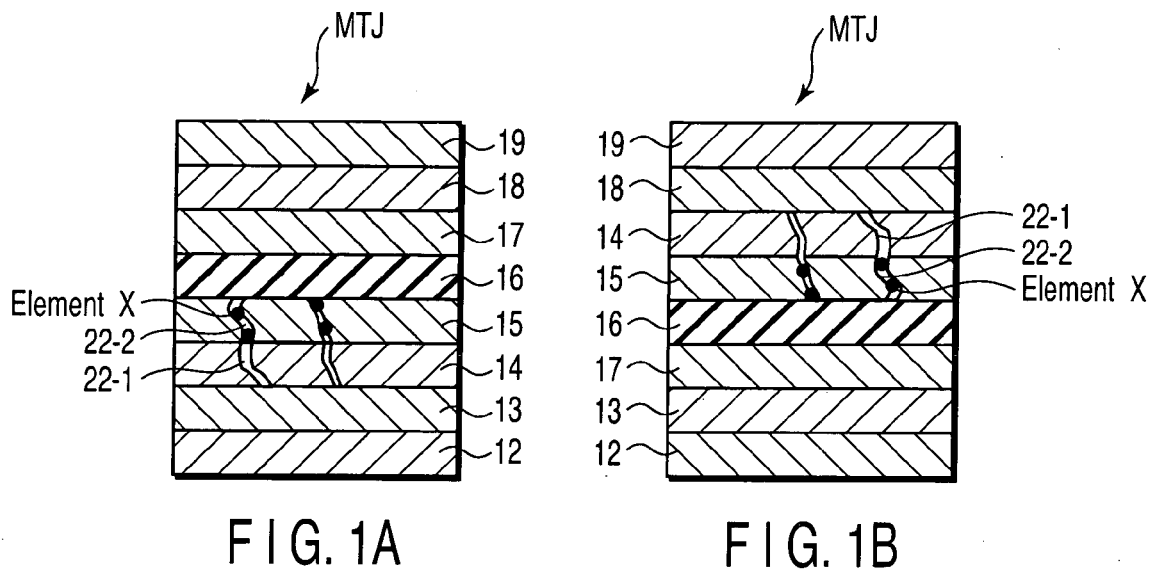
FIG. 1A is a sectional view of a magnetoresistance effect device according to a first embodiment of the present invention.
FIG. 1B is a sectional view of the magnetoresistance effect device according to the first embodiment of the present invention.

Embodiments of the present invention will be described below with reference to the accompanying drawings. Throughout the drawings, the same components are denoted by the same reference numerals.

First Embodiment

First, a magnetoresistance effect device according to a first embodiment of the present invention and a method of manufacturing the device will be described with reference to FIGS. 1A to 8.

FIGS. 1A and 1B are sectional views of an MTJ device of the magnetoresistance effect device according to the first embodiment.

Referring to FIG. 1A, the MTJ device is formed on a semiconductor substrate 11 and includes an electrode layer 12, an underlying conductive layer 13, an antiferromagnetic layer 14, a pin layer 15, a tunnel barrier layer 16, a free layer 17, a cap layer 18 and an electrode layer 19. These layers are stacked one on another in the order designated.

In the MTJ device shown in FIG. 1B, the free layer 17 and a layer of the pin and antiferromagnetic layers 15 and 14 are changed to each other. In other words, the pin layer 15 is formed on the free layer 17 with the tunnel barrier layer 16 therebetween, and the antiferromagnetic layer 14 is formed on the pin layer 15.

The antiferromagnetic layer 14 includes a crystal grain boundary 22-1. The layer 14 is formed of manganese platinum (PtMn), manganese nickel (NiMn), manganese iridium (IrMn) and the like.

The pin layer 15 includes a crystal grain boundary 22-2 that continues with the crystal grain boundary 22-1. Element X is segregated into the crystal grain boundary 22-2 to prevent the material of the antiferromagnetic layer 14 from diffusing into the crystal grain boundary 22-2. The pin layer 15 is formed of ferromagnetic materials containing cobalt (Co), iron (Fe) and nickel (Ni) as the principal ingredients.

The crystal grain boundaries 22-1 and 22-2 are formed continuously to the upper layer and arrive at the interface between the pin layer 15 and the tunnel barrier layer 16.

The pin layer 15, which is formed of ferromagnetic material, contacts the antiferromagnetic layer 14 and its magnetization direction is fixed to one direction by switched connection to the layer 14. This is generally called a spin bulb type MTJ device, in which only the magnetization direction of the free layer 17 can easily be inverted by a small magnetic field.

The antiferromagnetic layer 14 includes, e.g., manganese (Mn) as a constituting material in terms of that Mn is excellent in heat stability. The element such as Mn, which is included in the layer 14, diffuses along the crystal grain boundaries 22-1 and 22-2. However, it can be prevented from diffusing to the tunnel barrier layer 16 since the element X is segregated into the crystal grain boundary 22-2 to break the continuity of crystal and interrupt a diffusion path.

In the MTJ device shown in FIG. 1B, too, the element such as Mn, which is included in the layer 14, diffuses along the crystal grain boundaries 22-1 and 22-2 from above in a heat treatment step (described later). However, it can be prevented from diffusing to the tunnel barrier layer 16 since the element X is segregated into the crystal grain boundary 22-2 to break the continuity of crystal and interrupt a diffusion path.

In both the MTJ devices shown in FIGS. 1A and 1B, the material of the antiferromagnetic layer 14 can be prevented from reaching the interface between the pin layer 15 and the tunnel barrier layer 16. The spin polarizability of the ferromagnet used for the pin layer 15 can be prevented from decreasing and the output characteristics (MR ratio) can be prevented from deteriorating. The MTJ device can be configured as shown in FIG. 1A or FIG. 1B when the need arises.

In order to segregate the element X into the crystal grain boundary 22-2, it is desirable that the atomic radius of the element X be larger than that of each of cobalt (Co), iron (Fe) and nickel (Ni), which are the principal ingredients of the ferromagnetic material of the pin layer 15, and the element X be difficult to dissolve in the principal ingredients.

More specifically, it is desirable that the atomic radius of the element X be 15% larger than that of the principal ingredient such as cobalt (Co) for forming the pin layer 15. The reason is as follows. According to a phase diagram, the solid solubility of an atom whose radius is 15% larger than that of the principal ingredient of the pin layer 15, such as cobalt (Co), is likely to be smaller. It is desirable that the solid solubility of the atom be 10% or less and, more favorably, 5% or less.

The segregated element X is the ferromagnetic material of the pin layer. More specifically, it is at least one of calcium (Ca), titanium (Ti), vanadium (V), strontium (Sr), yttrium (Y), zirconium (Zr), niobium (Nb), barium (Ba), lanthanum (La), hafnium (Hf) and tantalum (Ta).

Figure 2:
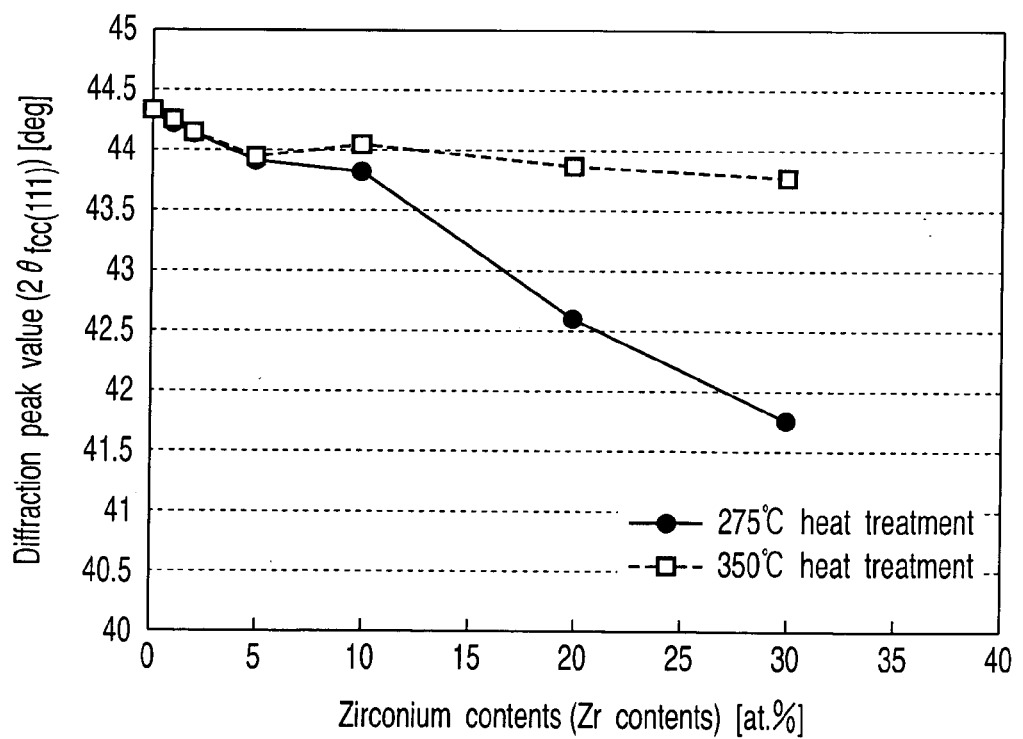
FIG. 2 is a graph showing a relationship between zirconium (Zr) contents and Fcc(111) diffraction peak value (Bragg angle 2θ)

FIG. 2 is a graph showing a relationship between Fcc(111) diffraction peak values (Bragg angle 2θ) and zirconium (Zr) contents (atomic percent [at. %]), which are measured by an X-ray diffractometer (XRD) when zirconium (Zr) is added to ferronickel (NiFe) as an example of the pin layer 15 shown in FIGS. 1A and 1B.

As is seen from the solid line in FIG. 2, the Fcc(111) diffraction peak value of NiFeZr comes close to that of NiFe in itself by heat treatment at about 350° C. This means that NiFe and Zr in NiFeZr are separated from each other, or Zr is segregated into the crystal grain boundary of NiFe. Similarly, if the above ferromagnetic material and element X are selected and subjected to heat treatment of 300° C. or higher, the element X can easily be segregated into the ferromagnetic material.

The pin layer 15 is formed in a step of introducing a magnetic target including Co, Fe and Ni and a simple target serving as the element X into a sputtering apparatus and then sputtering these targets. In this step, it is desirable that the content of element X be not higher than 30 [at. %].

Figure 3:
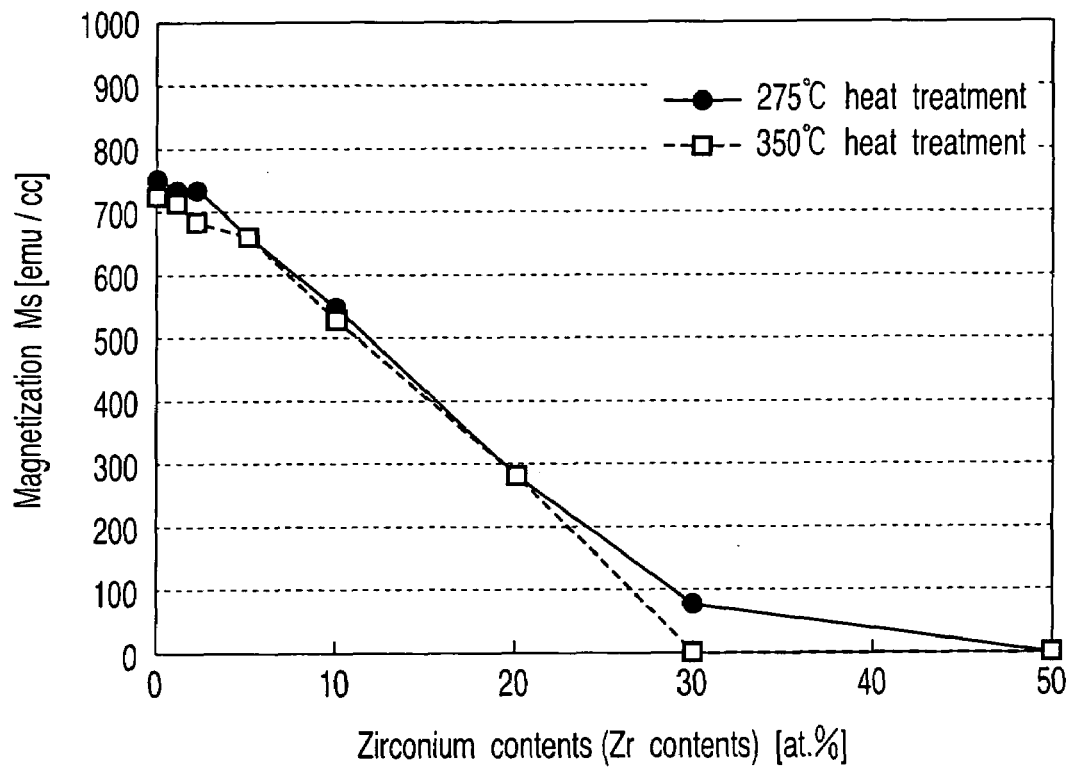
FIG. 3 is a graph showing a relationship between zirconium (Zr) contents and magnetization (Ms) when zirconium is added to ferronickel (NiFe)

FIG. 3 is a graph showing a relationship between zirconium (Zr) contents (atomic percent [at. %]) and magnetization (Ms [emu/cc]) when zirconium (Zr) is added to ferronickel (NiFe) as an example of the pin layer 15.

It is seen from FIG. 3 that the ferronickel is not suitable for the pin layer 15 because it is demagnetized if zirconium (Zr) is added by 30 [at. %] or more. If a ferromagnetic material is selected from the above as the element X and added to ferroelectric by about 30 [at. %], the ferronickel is demagnetized and not suitable for the pin layer 15. It is desirable that the content of the ferromagnetic material fall within a range from 5 to 20 [at. %] in terms of smoothness (described later).

The pin layer 15 can be formed by introducing a poly-alloy target, which is obtained by adding element X whose content falls within the above range to a ferromagnetic material in advance, into a sputtering apparatus and then sputtering the target. The pin layer 15 can also be formed by introducing the poly-alloy target into a so-called ion beam deposition (IBD) apparatus as well as the sputtering apparatus.

Figure 4:
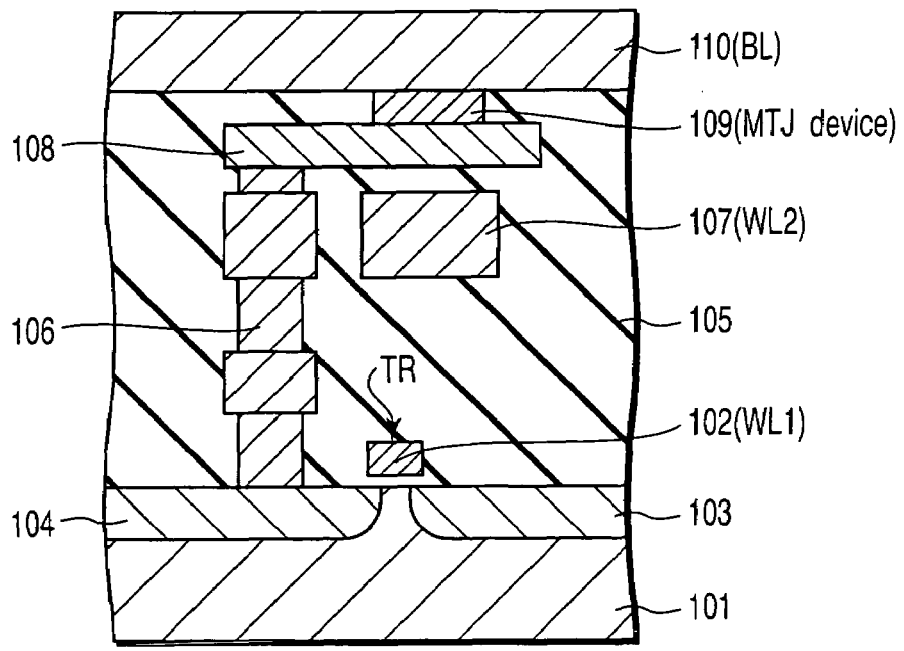
FIG. 4 is a sectional view of the magnetoresistance effect device according to the first embodiment of the present invention.

A magnetoresistance effect device according to the first embodiment of the present invention will be described with reference to FIG. 4. FIG. 4 is a sectional view of a storage cell (1T1MTJ type) of a magnetic memory device according to the first embodiment.

Referring to FIG. 4, a gate electrode 102 is formed above a silicon substrate 101, and source/drain regions 103 and 104 are formed in the surface area of the silicon substrate 101, except under the gate electrode 102. These components make up a selecting transistor TR. The gate electrode 102 extends in a direction perpendicular to the sheet of drawing (FIG. 4) and serves as a word line (WL1). An insulation layer 105 is formed on the entire surface of the silicon substrate 101 and includes a connection plug 106 connected to the drain region 104 of the selecting transistor TR, a word line (WL2) 107 extending in a direction perpendicular to the sheet of drawing (FIG. 4), an underlying electrode 108 connected to the connection plug 106, and an MTJ device 109 provided above the word line (WL2) 107 and connected to the underlying electrode 108. A bit line (BL) 110, which extends in a direction almost perpendicular to the word line (WL2) 107, is connected to the top surface of the MTJ device 109.

The MTJ device 109 corresponds to the stacked-layer structures shown in FIGS. 1A and 1B, which have been described and those shown in FIGS. 10, 18 and 21, which will be described later. In the magnetoresistance effect device according to the first embodiment, an element X is segregated into the crystal grain boundary 22-2, which continues with the crystal grain boundary 22-1 in the pin layer 15, in order to prevent the material of the antiferromagnetic layer 14 from diffusing, as described above.

Therefore, the crystal grain boundary 22-2, which is a diffusion path extending to the tunnel barrier layer 16, can be broken to prevent the material (e.g., Mn) of the antiferromagnetic layer 14 from diffusing to the tunnel barrier layer 16. Consequently, the material of the layer 14 can be prevented from reaching the interface between the pin layer 15 and the tunnel barrier layer 16, thereby preventing the spin polarizability of a ferromagnet used for the pin layer 15 from decreasing and also preventing the output characteristics (MR ratio) from deteriorating.

Since the drain region 104 of the selecting transistor TR and the MTJ device are electrically connected to each other, a so-called sneak current can be prevented from being generated. The magnetic memory device therefore has the advantage of improving in reliability.

As described above, the magnetic memory device includes the word line (WL2) 107 extending in a direction perpendicular to the sheet of drawing (FIG. 4), the bit line 110 extending above the word line (WL2) 107 and in a direction almost perpendicular to the word line 107, and the MTJ device 109 provided between the word line 107 and the bit line 110. An operation of writing data to the MTJ device 109 is performed by causing a write current to flow through the word and bit lines 107 and 110 to generate current magnetic fields and then inverting the magnetization of a magnetized free layer of the MTJ device 109 by a combination of the magnetic fields. An operation of reading data out of the MTJ device 109 is performed by turning on the selecting transistor and causing a sense current to flow through the MTJ device 109 to measure a variation in magnetoresistance.

A method of manufacturing a magnetoresistance effect device according to the first embodiment will be described, taking the magnetic memory device shown in FIG. 4 as an example.

First, a peripheral circuit such as a selecting transistor TR, a connection plug, and word lines WL1 and WL2 is formed on a semiconductor (silicon) substrate 101 in a well-known step.

Figure 5:
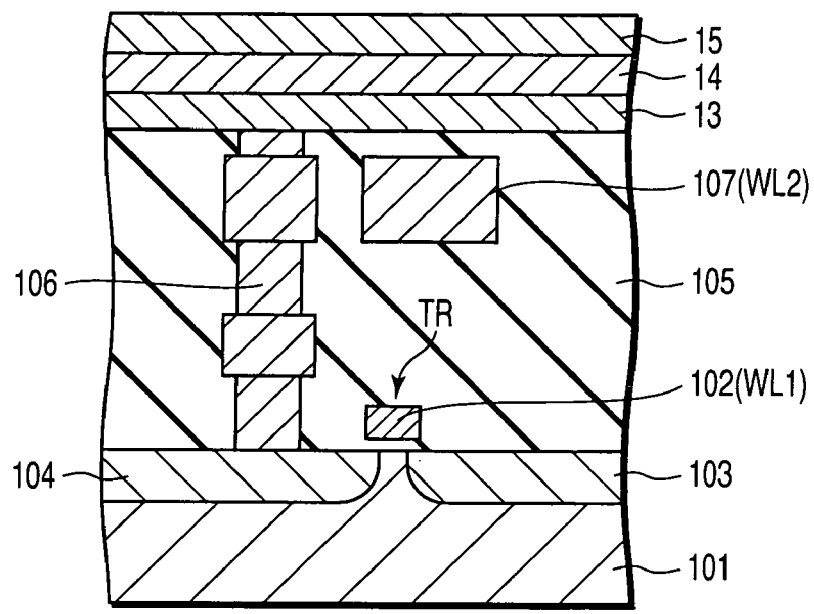
FIG. 5 is a sectional view showing a step of manufacturing the magnetoresistance effect device according to the first embodiment of the present invention.

Referring then to FIG. 5, an underlying conductive layer 13 is formed on an insulation layer 105 by, e.g., sputtering to serve as an underlying electrode 108 connected to the plug. An antiferromagnetic material (e.g., Mn) is deposited on the underlying conductive layer 13 to form an antiferromagnetic layer 14.

Subsequently, a pin layer 15 is formed on the antiferromagnetic layer 14 by the foregoing technique. In this step, it is desirable that the content of element X to be added to the pin layer 15 be not higher than 30 [at. %] and it is more desirable that the content fall within a range from 5 to 20 [at. %] in terms of smoothness. If the element X is added to the pint layer 15 by 30 [at. %] or more, the pin layer 15 is demagnetized and thus inapplicable.

Figure 6:
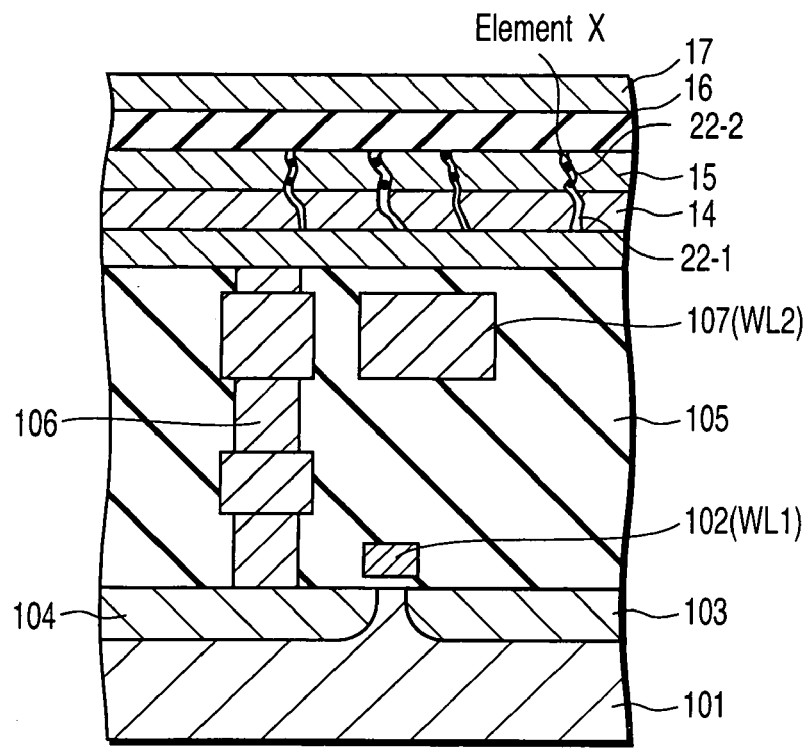
FIG. 6 is a sectional view showing a step of manufacturing the magnetoresistance effect device according to the first embodiment of the present invention.

Referring then to FIG. 6, when the antiferromagnetic layer 14 is formed, the layer 14 and the pin layer 15 are heated at 300° C. or higher to promote the segregation of element X into the crystal grain boundary 22-2 in the pin layer 15.

Even though all TMR films (MTJ devices) are formed and then heated at 300° C. or higher, the segregation of element X into the crystal grain boundary 22-2 can be promoted.

After that, a tunnel barrier layer 16 is formed on the pin layer 15 and a free layer 17 is formed on the layer 16 in the step described above.

Figure 7:
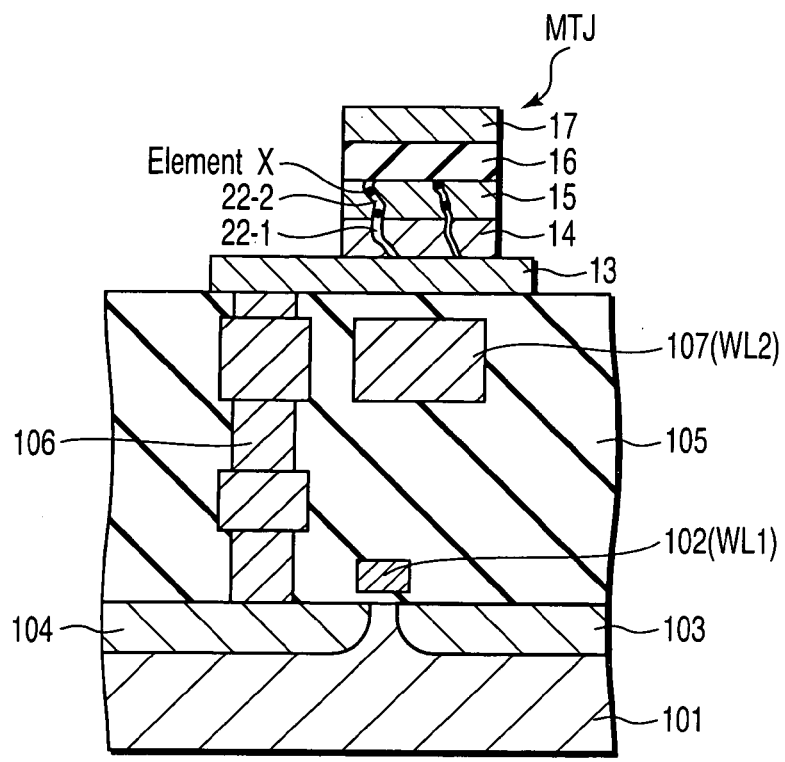
FIG. 7 is a sectional view showing a step of manufacturing the magnetoresistance effect device according to the first embodiment of the present invention.

Referring then to FIG. 7, the resultant stacked layers are separated by RIE, ion milling or the like to form a lower electrode 13 (108) and an MTJ device.

Figure 8:
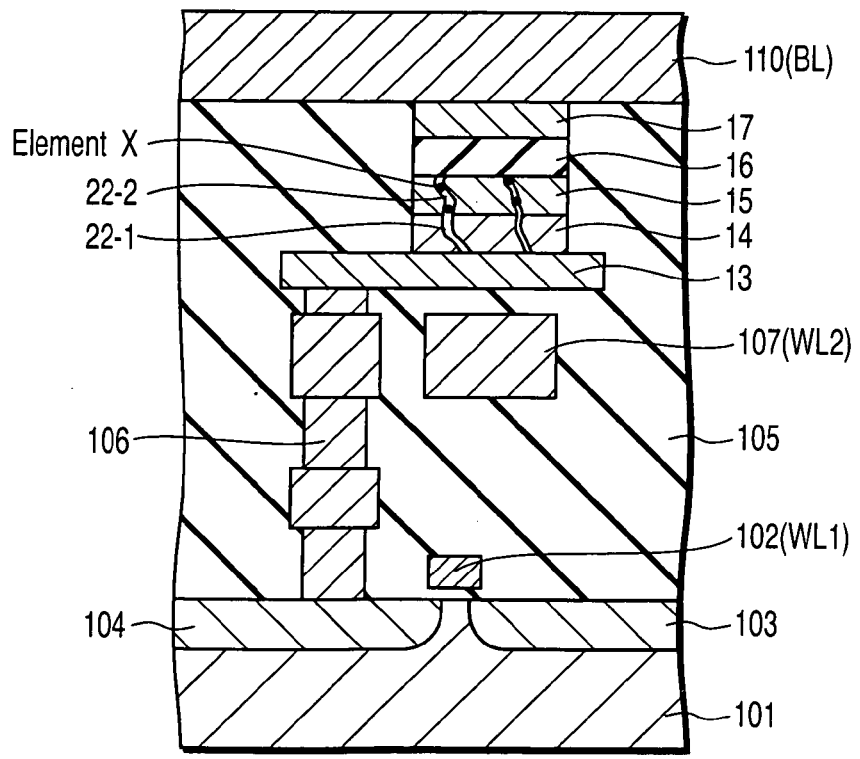
FIG. 8 is a sectional view showing a step of manufacturing the magnetoresistance effect device according to the first embodiment of the present invention.

Referring then to FIG. 8, a bit line 110 is formed in a well-known step, thereby completing a magnetoresistance effect device as shown in FIG. 4.

Since a method of manufacturing the MTJ devices shown in FIGS. 1A and 1B is substantially the same as the above method, its detailed descriptions will be omitted.

With the method described above, the antiferromagnetic layer 14 and pin layer 15 can be crystal-grown sufficiently by high-temperature heat treatment to improve in magnetic characteristics. Since the element X added to the pin layer 15 is segregated, a diffusion path is interrupted to prevent the material of the antiferromagnetic layer 14 from diffusing to the tunnel barrier layer 16. Accordingly, the output characteristics can be prevented from deteriorating.

[First Modification (Structure of Synthetic Pin)]

A magnetoresistance effect device according to a first modification will be described with reference to FIG. 9. This magnetoresistance effect device relates to a so-called synthetic pin layer. The descriptions of the same components as those of the first embodiment will be omitted.

Figure 9:
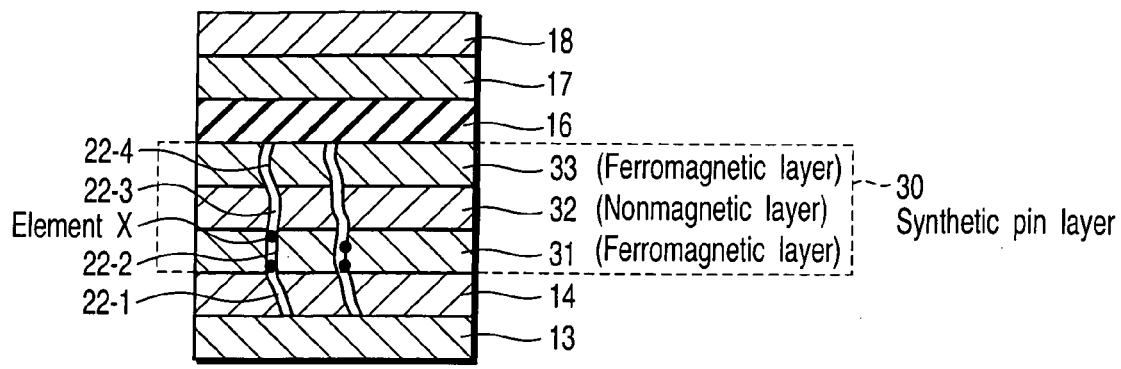
FIG. 9 is a sectional view of a magnetoresistance effect device according to a first modification.

As shown in FIG. 9, a synthetic pin layer 30 having a laminated structure of a ferromagnetic layer 31, a nonmagnetic layer 32 and a ferromagnetic layer 33 is provided on an antiferromagnetic layer 14. In the synthetic pin layer 30, the ferromagnetic layers 31 and 33 are antiferromagnetically coupled to each other with the nonmagnetic layer 32 therebetween.

The ferromagnetic layer 31 includes a crystal grain boundary 22-2 that continues with a crystal grain boundary 22-1 and an element X that is segregated into the crystal grain boundary 22-2 to prevent the material (e.g., Mn) of the antiferromagnetic layer 14 from diffusing. The ferromagnetic layer 31 is formed of ferrocobalt (CoFe) or the like.

The nonmagnetic layer 32 includes a crystal grain boundary 22-3 that continues with the crystal grain boundary 22-2. The layer 32 is formed of ruthenium (Ru) or the like.

The magnetic layer 33 includes a crystal grain boundary 22-4 that continues with the crystal grain boundary 22-3. The layer 33 is formed of ferrocobalt (CoFe) or the like.

The magnetoresistance effect device according to the first modification can produce the same advantages as those of the first embodiment. In the ferromagnetic layer 31, the element X is segregated into the crystal grain boundary 22-2 that continues from the crystal grain boundary 22-1 to interrupt a diffusion path.

Therefore, the material of the antiferromagnetic layer 14 does not reach the nonmagnetic layer 32 or the interface between the nonmagnetic layer 32 and the ferromagnetic layer 31 is not destroyed. The ferromagnetic layers 31 and 33 can be prevented from decreasing in their antiferromagnetic coupling. Consequently, the magnetization direction of the synthetic pin layer 30 can be stabilized and the output characteristics can be prevented from deteriorating.

Furthermore, a magnetic line of force is closed like a loop with two ferromagnetic layers 31 and 33 between which the nonmagnetic layer 32 is interposed. Thus, a magnetic field leaking to a free layer 17 can be decreased. The magnetoresistance effect device according to the first modification therefore has the advantage of improving in reliability.

A method of manufacturing the magnetoresistance effect device according to the first modification is substantially the same as that in the first embodiment. Its detailed descriptions are omitted accordingly.

Second Embodiment

A magnetoresistance effect device according to a second embodiment of the present invention will now be described with reference to FIGS. 10 to 14. The descriptions of the same components as those of the first embodiment will be omitted.

Figure 10:
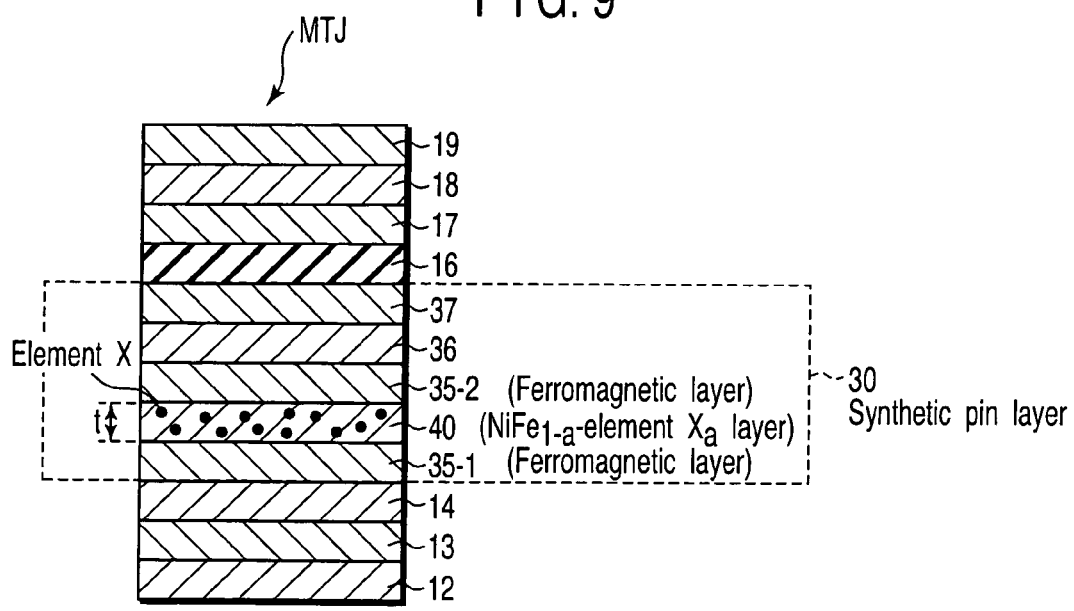
FIG. 10 is a sectional view of a magnetoresistance effect device according to a second embodiment of the present invention.

As shown in FIG. 10, the magnetoresistance effect device includes a synthetic pin layer 30. The layer 30 includes a ferromagnetic layer 35-1, a ferromagnetic layer 35-2, and a NiFe layer 40 (hereinafter referred to as a diffusion prevention layer or a $NiFe_{1-a}$-element $X_a$ layer). The NiFe layer 40 is interposed between the layers 35-1 and 35-2 and has an element X segregated into ferronickel (NiFe) with content a to prevent the material of an antiferromagnetic layer 14 from diffusing. The content a is the content of element X in the entire NiFe layer.

It is desirable that the atomic radius of the element X be larger than that of each of the principal ingredients of ferronickel (NiFe), such as nickel (Ni) and iron (Fe) and the element X be difficult to dissolve in the principal ingredients.

More specifically, it is desirable that the atomic radius of the element X be about 15% larger than that of each of the principal ingredients of ferronickel (NiFe). The element X includes at least one of calcium (Ca), titanium (Ti), vanadium (V), strontium (Sr), yttrium (Y), zirconium (Zr), niobium (Nb), barium (Ba), lanthanum (La), hafnium (Hf) and tantalum (Ta).

Providing the NiFe layer 40 including a NiFeZr layer having a NiFe crystal grain boundary into which zirconium (Zr) is segregated, a diffusion path through which the material (e.g., Mn) of the antiferromagnetic layer 14 reaches a nonmagnetic layer 36 can be interrupted. Accordingly, the interface can be prevented from being destroyed, and the ferroelectric layers 37, 35-1 and 35-2 can be prevented from decreasing in their antiferromagnetic coupling.

It is desirable that the thickness $t$ of the NiFe layer ($NiFe_{1-a}$-element $X_a$ layer) 40 fall within a range of $0.3 \leq t \leq 2$ [nm]). If $t$ is smaller than 0.3 (t<3), no diffusion suppression effect can be obtained. If $t$ is larger than two (2<t), switched-connection magnetic fields Hua and Hua* are narrowed to have an influence on the inversion of magnetization of the free layer 17.

An MH curve, which is obtained when the content a is 10 and the element X is zirconium (Zr) or when $NiFe_{90}$—$Zr_{10}$ is used as an example of the $NiFe_{1-a}$-element $X_a$ layer 40, will be described with reference to FIGS. 11, 12, 24 and 25.

Figure 11:
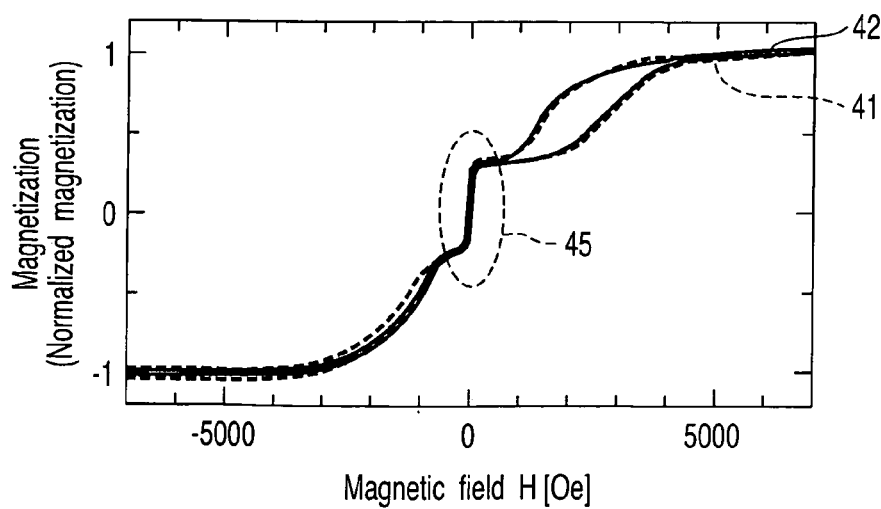
FIG. 11 is a graph of an MH curve of the magnetoresistance effect device according to the second embodiment of the present invention.
Figure 12:
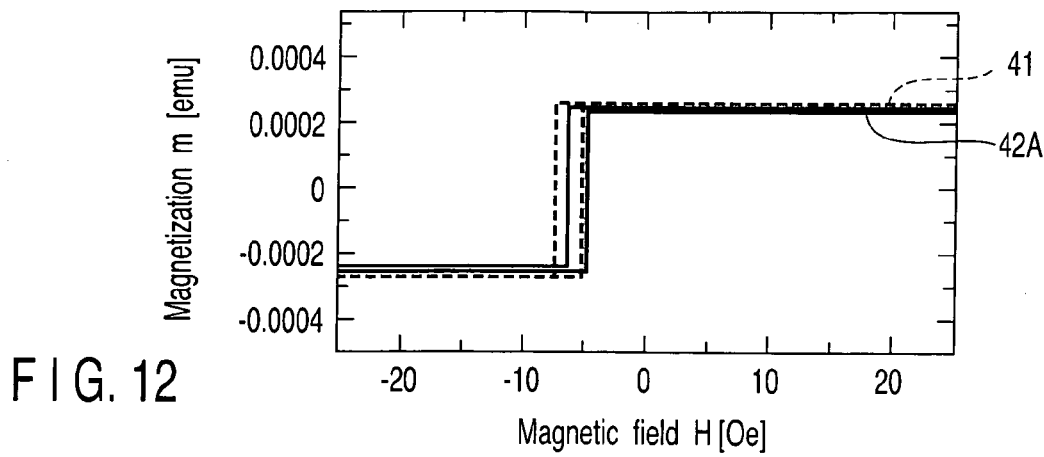
FIG. 12 is a graph of the MH curve close to a magnetic field used for a write operation indicated in FIG. 11.

FIG. 11 shows an MH curve of the magnetoresistance effect device according to the second embodiment, in which $NiFe_{90}$—$Zr_{10}$ is inserted as the $NiFe_{1-a}$-element $X_a$ layer 40. FIG. 12 shows a minor loop close to the area circled by broken line 45 in FIG. 11 and a variation in magnetization caused when a magnetic field is changed to the actually used magnetic-field region (about 100 [Oe]).

Figure 24:
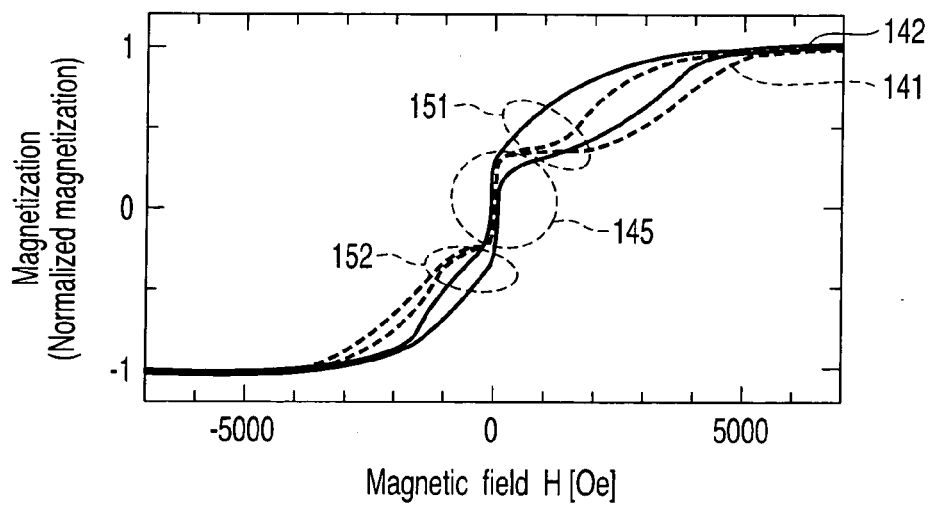
FIG. 24 is a graph showing an MH curve obtained when a $NiFe_{1-a}$-element $X_a$ layer is not inserted.
Figure 25:
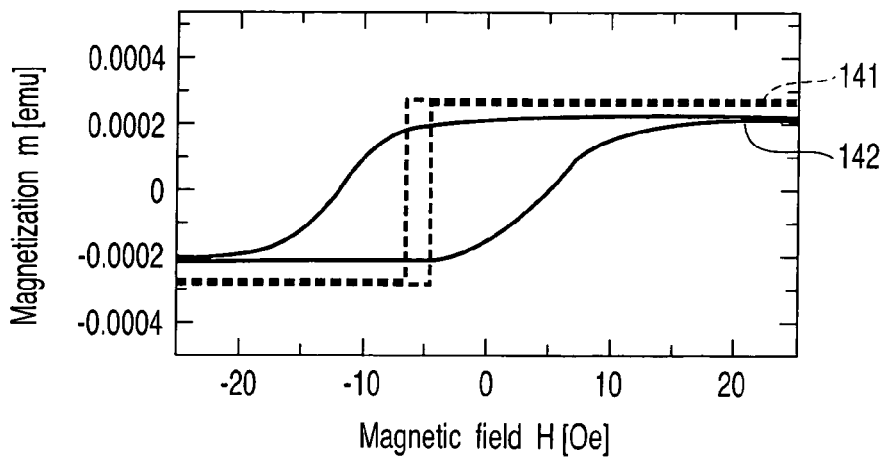
FIG. 25 is a graph of the MH curve close to a magnetic field used for a write operation indicated in FIG. 24.

FIG. 24 shows an MH curve of the magnetoresistance effect device in which the $NiFe_{1-a}$-element $X_a$ layer 40 is not inserted. FIG. 25 shows a minor loop close to the area circled by broken line 145 in FIG. 24 and a variation in magnetization caused when a magnetic field is changed to the actually used magnetic-field region (about 100 [Oe]).

Broken line 41 in FIGS. 11 and 12 is an MH curve after heat treatment at about 275° C., as is broken line 141 in FIGS. 24 and 25. Solid line 42 in FIG. 11 is an MH curve after heat treatment at about 350° C., as is solid line 142 in FIGS. 24 and 25.

As is seen from solid line 142 in the areas circled by broken lines 151 and 152, a flat portion is lost to break a synthetic pin structure in a magnetoresistance effect device having only a synthetic pin layer.

As is apparent from solid line 142 in FIG. 25, the initial magnetization structure is destroyed after heat treatment at about 350° C.

As is seen from solid lines 42 and 42A in FIGS. 11 and 12, the magnetoresistance effect device according to the second embodiment does not vary greatly in magnetization characteristic even after heat treatment at about 350° C., but keeps the magnetization characteristic and thus improves in heat resistance.

Figure 13:
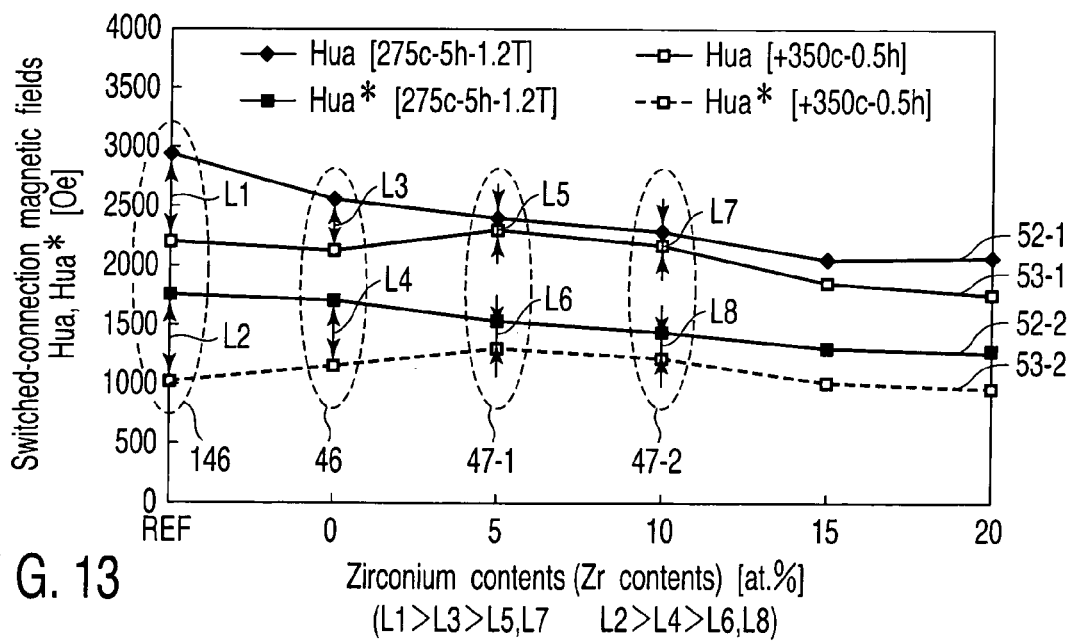
FIG. 13 is a graph showing a relationship between zirconium (Zr) contents and a switched connection magnetic field.

Referring then to FIG. 13, a relationship between the composition of zirconium (Zr) and switched-connection magnetic fields Hua and Hua* will be described. In FIG. 13, solid lines 52-1 and 52-2 indicate the relationship after heat treatment at about 275° C., while solid line 53-1 and broken line 53-2 indicate the relationship after heat treatment at about 350° C.

The switched-connection magnetic fields Hua and Hua* are indices representing the strength of switched connection (coupling) between the ferromagnetic layer 37 and each of the ferromagnetic layers 35-1 and 35-2 in the synthetic pin layer 30.

The area circled by broken line 146 in FIG. 13 is an example of the magnetoresistance effect device in which the $NiFe_{1-a}$-element $X_a$ layer 40 is not inserted, while the area circled by broken line 46 in FIG. 13 is an example of the device in which a NiFe layer with no zirconium (Zr) is inserted.

As is indicated by broken line 146, the switched-connection magnetic fields Hua and Hua* are decreased in width by L1 and L2, respectively (about 40% decrease) after heat treatment at about 350° C. Thus, the magnetization direction of the pin layer becomes unstable and the magnetization inversion process of the free layer varies to cause a decrease in output characteristics.

In contrast, even though a NiFe layer with no zirconium (Zr) is inserted, switched-connection magnetic fields Hua and Hua* are decreased in width by L3 and L4 which are smaller than L1 and L2, respectively (L1>L3, L2>L4), as indicated by broken line 46 in FIG. 13.

When a NiFe layer 40 with zirconium of about 5% is inserted, the switched-connection magnetic fields Hua and Hua* are hardly decreased and, in other words, they are decreased in width by L5 and L6 which are much smaller than L3 and L4, respectively (L1>L3>L5, L2>L4>L6), as indicated by broken line 47-1.

Similarly, when a NiFe layer 40 with zirconium of about 10% is inserted, the switched-connection magnetic fields Hua and Hua* are hardly decreased and, in other words, they are decreased in width by L7 and L8 which are much smaller than L3 and L4, respectively (L1>L3>L7, L2>L4>L8), as indicated by broken line 47-2.

Even after heat treatment at about 350° C., the device does not greatly vary in magnetic characteristic, but improves in heat resistance, as shown in FIG. 13. It is thus desirable that the content $a$ of zirconium (Zr) fall within a range of $5 \leq a \leq 15$ [at. %] in terms of heat resistance.

A relationship between zirconium (Zr) contents $a$ [at. %] and each of surface roughness Ra [nm] and crystal grain size D [nm] of NiFeZr will be described with reference to FIGS. 14 and 15. The surface roughness Ra [nm] is obtained by atomic force microscopy (AFM) and structural analysis using a tomography transmission electron microscope (TEM), and the crystal grain size D [nm] is done by an X-ray diffractometer (XRD).

Figure 14:
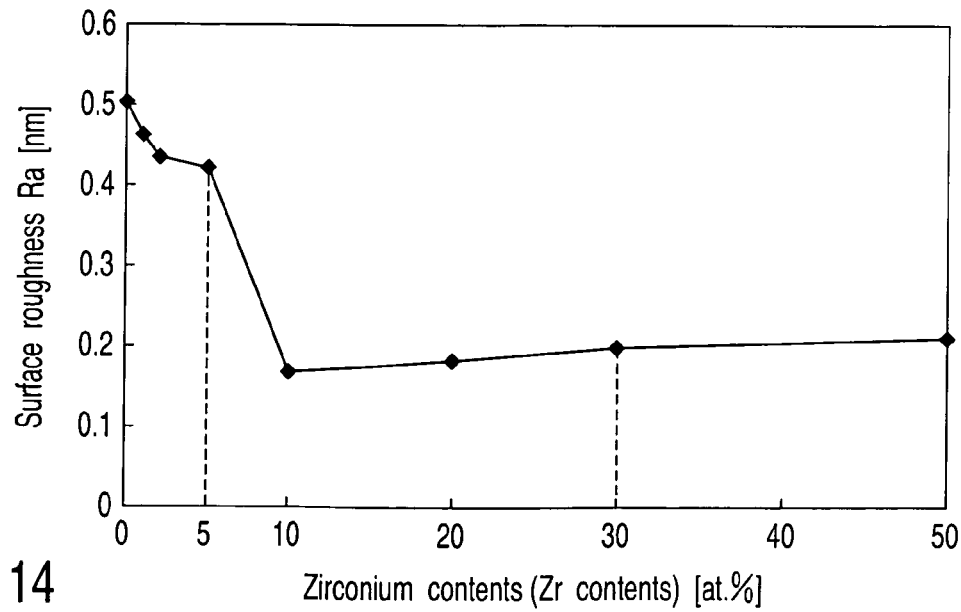
FIG. 14 is a graph showing a relationship between zirconium (Zr) contents and surface roughness.
Figure 15:
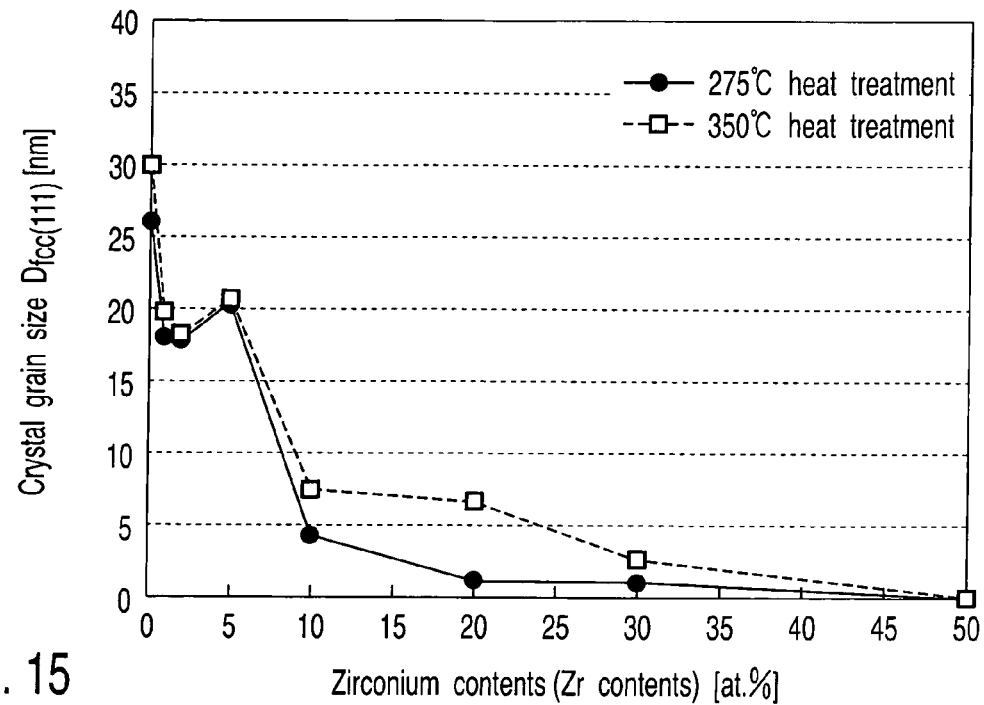
FIG. 15 is a graph showing a relationship between zirconium (Zr) contents and crystal grain size.

It is seen from FIG. 14 that the surface roughness of the NiFe—Zr layer 40 is large within a range of a<5 [at. %]. This is because the crystal grains of NiFe crystal in the NiFe—Zr layer 40 are large in this range.

In a range of $5 \leq a \leq 30$ [at. %], the surface roughness of the NiFe—Zr layer 40 is greatly reduced. This is because the crystal grains of NiFe crystal in the NiFe—Zr layer 40 can be decreased in size. To make the crystal grains fine means that a crystal grain boundary is microfabricated and brings the advantages that a crystal grain boundary, which serves as a diffusion path through which the material (e.g., Mn) of the antiferromagnetic layer 14 reaches the nonmagnetic layer 36, is made discontinuous and zirconium (Zr) is segregated into the crystal grain boundary to suppress the diffusion of the material further.

The smoothness is very important from the viewpoint of a reduction in variations in magnetic characteristic and resistance between MTJ devices each used as an MRAM. If the smoothness is not adequate, the variations are caused by magnetostatic coupling between a pin layer and a free layer with a barrier layer therebetween, stress due to a warp, difference in barrier layer thickness among the MTJ devices, etc.

If the content a of zirconium (Zr) is selected to fall within a range of $5 \leq a \leq 30$ [at. %], the smoothness can be improved and so can be the reliability.

Figure 16:
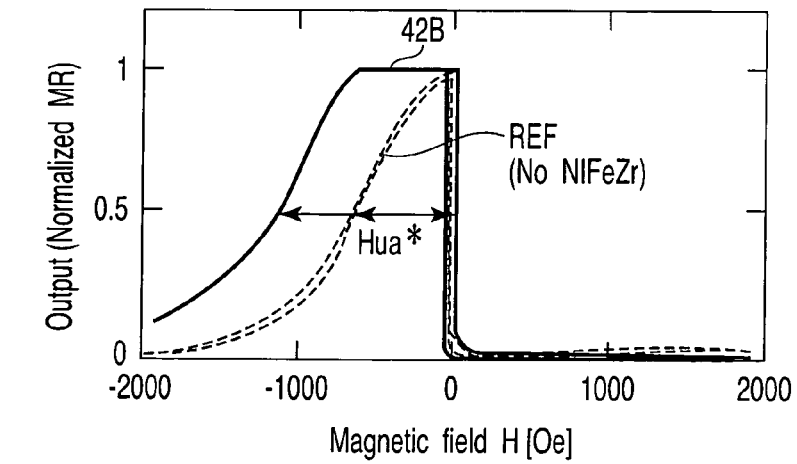
FIG. 16 is a graph showing a relationship between a magnetic field and an output of the magnetoresistance effect device according to the second embodiment of the present invention.

As described above, it is desirable that the content a of zirconium (Zr) fall within a range of $5 \leq a \leq 12$ [at. %] to improve the heat resistance (FIG. 14) and the smoothness (FIG. 16).

Since a method of manufacturing the magnetoresistance effect device according to the second embodiment is substantially the same as that in the first embodiment, its detailed descriptions are omitted.

In the magnetoresistance effect device, the diffusion prevention layer (NiFe$_{1-a}$-element X$_a$ layer) 40 having element X that is segregated into ferronickel (NiFe) with content a is provided between the ferromagnetic layers 35-1 and 35-2 that make up the synthetic pin layer 30. The layer 40 can thus interrupt a diffusion path through which the material (e.g., Mn) of the antiferromagnetic layer 14 reaches the nonmagnetic layer 36. Consequently, the material (e.g., Mn), which is to destroy an interface, can be interrupted to keep the interface and prevent the antiferromagnetic coupling of ferroelectric layers 37, 35-1 and 35-2 from decreasing. Moreover, the deterioration of output characteristics due to the decrease in antiferromagnetic coupling can be prevented.

If the content a of element X (e.g., Zr) is selected to fall within a range of $5 \leq a \leq 15$ [at. %], heat resistance can be improved (FIG. 13). If the content a of element X (e.g., Zr) is selected to fall within a range of $5 \leq a \leq 30$ [at. %], the diffusion prevention layer 40 can be improved in smoothness (FIG. 14). That is, if the content a of element X (e.g., Zr) is selected to fall within a range of $5 \leq a \leq 15$ [at. %], heat resistance and smoothness can be improved.

If the thickness t of the diffusion prevention layer (NiFe$_{1-a}$-element X$_a$ layer) 40 is selected to fall within a range of $0.3 \leq t \leq 2$ [nm], the diffusion suppression effect can be obtained, and an influence of magnetic inversion can be prevented.

More specifically, CoFe, NiFe$_{90}$—Zr$_{10}$, CoFe, Ru and CoFe were used as the ferromagnetic layer 35-1, NiFe$_{1-a}$-element X$_a$ layer 40, ferromagnetic layer 35-2, nonmagnetic layer 36 and ferromagnetic layer 37, respectively to form a laminated layer of the MTJ device shown in FIG. 10. The laminated layer was processed to a device size of 0.24×0.6 µm. In the processed laminated layer, a relationship between output characteristics and heat treatment temperatures was investigated. The results of the investigation will be described with reference to FIGS. 16 and 17. FIG. 16 is a graph showing a relationship between an output (MR) and a magnetic field (H), and FIG. 17 is a graph showing a relationship between an output (MR) and annealing temperature.

When no NiFe$_{90}$—Zr$_{10}$ is added, or when no diffusion prevention layer for preventing the material (e.g., Mn) of an antiferromagnetic layer from diffusing is formed (REF in FIGS. 16 and 17), pin characteristics (Hua*) degrade at 350° C., and output characteristics (MR characteristics) deteriorate.

Figure 17:
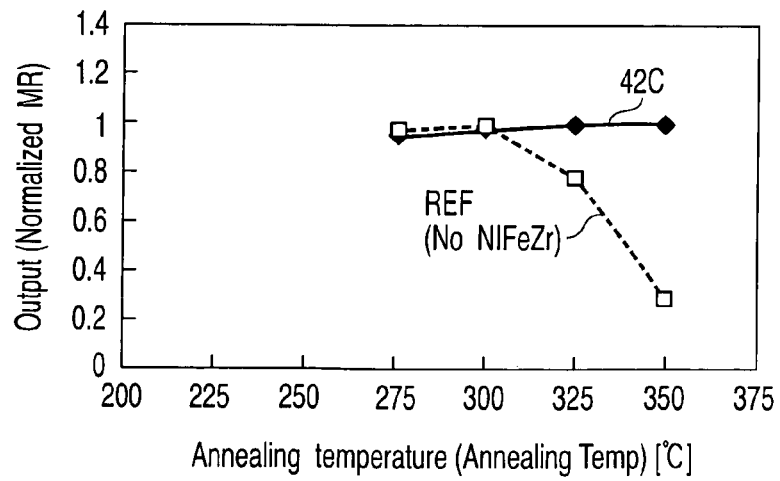
FIG. 17 is a graph showing a relationship between annealing temperature and an output of the magnetoresistance effect device according to the second embodiment of the present invention.

When NiFe$_{90}$—Zr$_{10}$ is added as indicated by solid lines 42B and 42C in FIGS. 16 and 17, the pin characteristics do not deteriorate, or the output characteristics (MR) hardly deteriorate even after high-temperature heat treatment.

[Second Modification]

Figure 19:
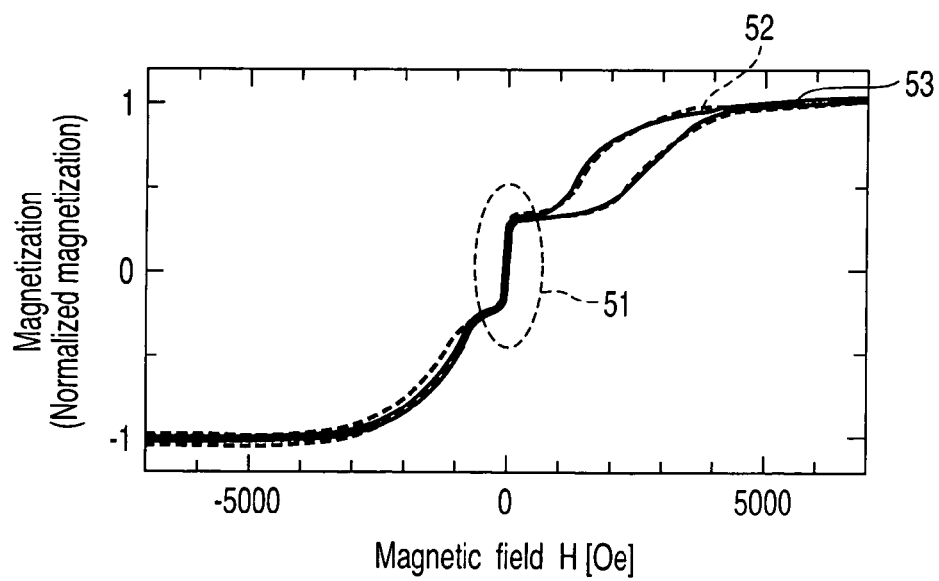
FIG. 19 is a graph of an MH curve of the magnetoresistance effect device according to the second modification.
Figure 20:
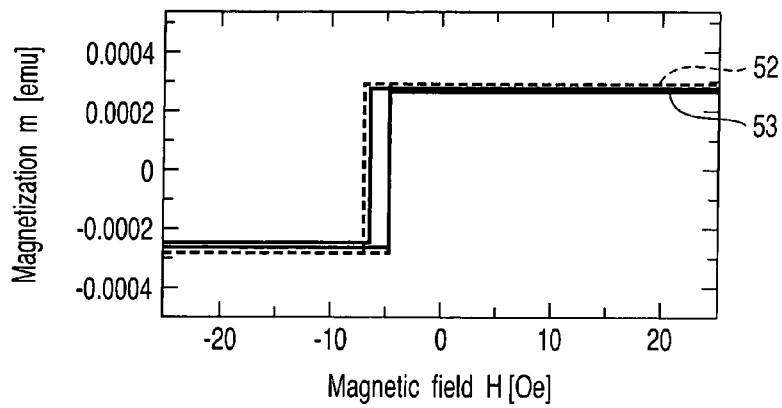
FIG. 20 is a graph of the MH curve close to a magnetic field used for a write operation indicated in FIG. 19.

A magnetoresistance effect device according to a second modification will be described with reference to FIGS. 18 to 20. The descriptions of the same components as those of the second embodiment will be omitted.

Figure 18:
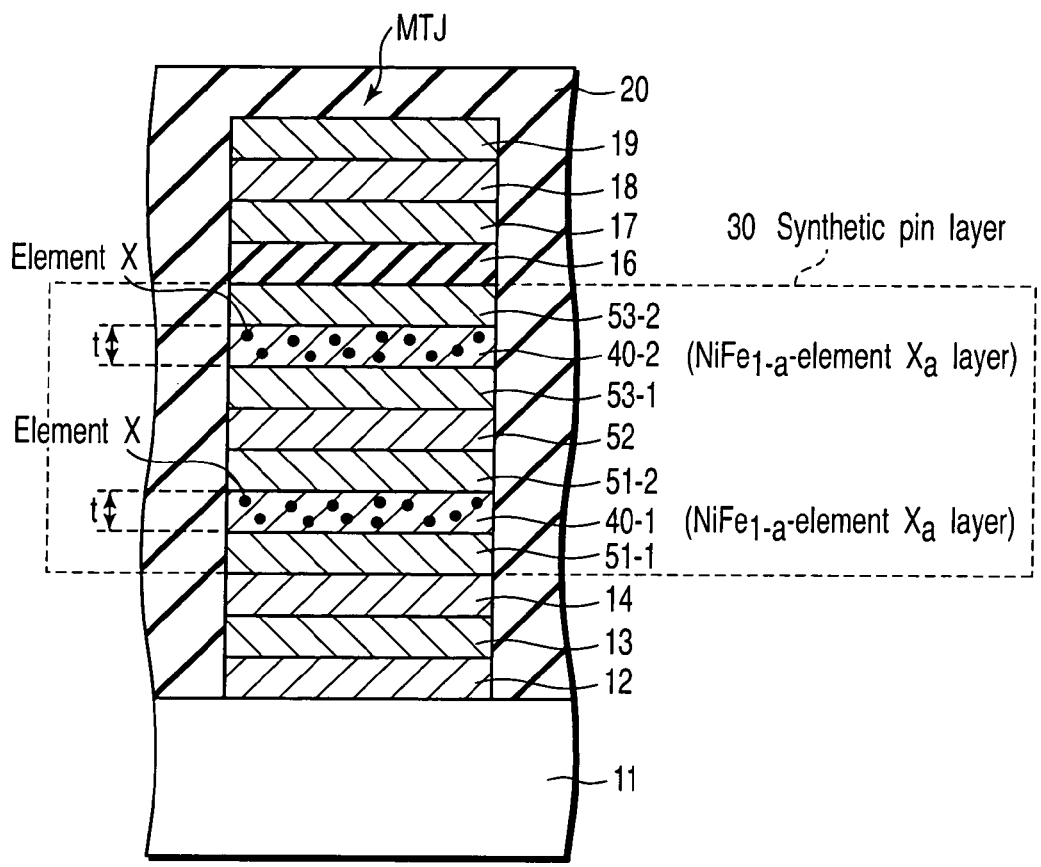
FIG. 18 is a sectional view of a magnetoresistance effect device according to a second modification.

FIG. 18 is a sectional view of the magnetoresistance effect device according to the second modification. FIG. 19 is a graph showing an MH curve of the device. FIG. 20 is a graph showing a minor loop close to the area circled by broken line 51 in FIG. 19 and a variation in magnetization caused when a magnetic field is changed to the actually used magnetic-field region (about 100 [Oe]). In FIGS. 18 to 20, broken line 52 indicates an MH curve after heat treatment at about 275° C. and solid line 53 indicates an MH curve after heat treatment at about 350° C.

As shown in FIG. 18, a synthetic pin layer 30 includes ferromagnetic layers 51-1 and 51-2 and a diffusion prevention layer (NiFe$_{1-a}$-element X$_a$ layer) 40-1. The diffusion prevention layer 40-1 is interposed between the layers 51-1 and 51-2 to prevent the material of an antiferromagnetic layer 14 from diffusing. The layer 40-1 has an element X segregated into ferronickel (NiFe) with content a.

The synthetic pin layer 30 also includes ferromagnetic layers 53-1 and 53-2 and a diffusion prevention layer (NiFe$_{1-a}$-element X$_a$ layer) 40-2. The diffusion prevention layer 40-2 is interposed between the layers 53-1 and 53-2 to prevent the material of the antiferromagnetic layer 14 from diffusing. The layer 40-2 has an element X segregated into ferronickel (NiFe) with content a.

In other words, a laminated structure having the ferromagnetic layer 51-1, NiFe$_{1-a}$-element X$_a$ layer 40-1, ferromagnetic layer 51-2, nonmagnetic layer 52, ferromagnetic layer 53-1, NiFe$_{1-a}$-element X$_a$ layer 40-2, and ferromagnetic layer 53-2, which are arranged from the antiferromagnetic layer 14, is provided to serve as a pin layer (magnetized fixing layer).

As is seen from solid line 53, the magnetoresistance effect device according to the second modification does not greatly vary in magnetization characteristic even after heat treatment at about 350° C., but keeps the magnetic characteristic and thus improves in heat resistance.

Since a method of manufacturing the magnetoresistance effect device according to the second modification is substantially the same as that in the first embodiment, its detailed descriptions are omitted.

With the above structure, the same advantages as those of the second embodiment can be obtained. Since, moreover, the diffusion prevention layer (NiFe$_{1-a}$-element X$_a$ layer) 40-2 is interposed between the ferromagnetic layers 53-1 and 53-2, a diffusion path is interrupted to prevent the material of the antiferromagnetic layer 14 from diffusing to a tunnel barrier layer 16. Consequently, the interface structure of the tunnel barrier layer 16 is prevented from being destroyed and thus improved in reliability.

[Third Modification]

A magnetoresistance effect device according to a third modification will be described with reference to FIGS. 21 to 23. The descriptions of the same components as those of the second embodiment will be omitted.

Figure 21:
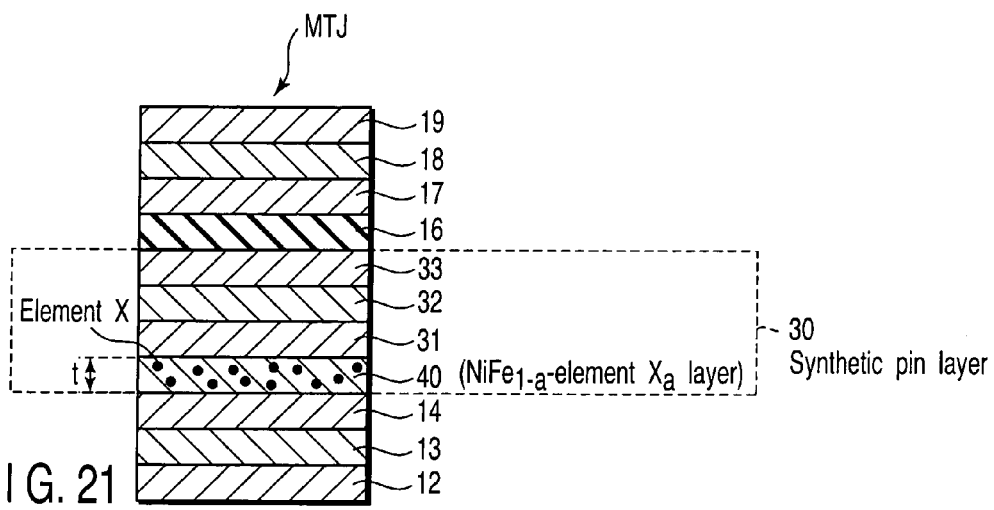
FIG. 21 is a sectional view of a magnetoresistance effect device according to a third modification.
Figure 22:
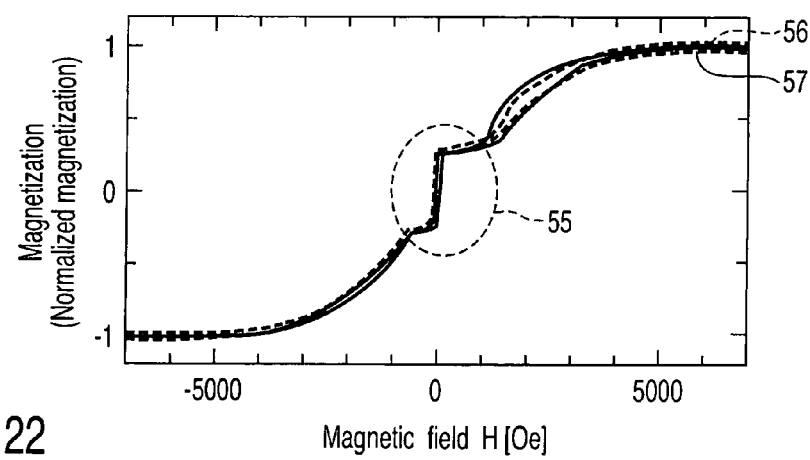
FIG. 22 is a graph of an MH curve of the magnetoresistance effect device according to the third modification.

FIG. 21 is a sectional view of the magnetoresistance effect device according to the third modification. FIG. 22 is a graph showing an MH curve of the device. FIG. 23 is a graph showing a minor loop close to the area circled by broken line 55 in FIG. 22 and a variation in magnetization caused when a magnetic field is changed to the actually used magnetic-field region (about 100 [Oe]). In FIGS. 21 to 23, broken line 56 indicates an MH curve after heat treatment at about 275° C. and solid line 57 indicates an MH curve after heat treatment at about 350° C.

As shown in FIG. 21, a diffusion prevention layer (NiFe$_{1-a}$-element X$_a$ layer) 40 is provided between an antiferromagnetic layer 14 and a magnetic layer 31 that forms a synthetic pin layer 30. The layer 40 has an element X segregated into ferronickel (NiFe) with content a to prevent the material of the layer 14 from diffusing.

In other words, a laminated structure of the NiFe$_{1-a}$-element X$_a$ layer 40, ferromagnetic layer 31, nonmagnetic layer 32, and ferromagnetic layer 33, which are arranged from the antiferromagnetic layer 14, is provided to serve as a pin layer.

Figure 23:
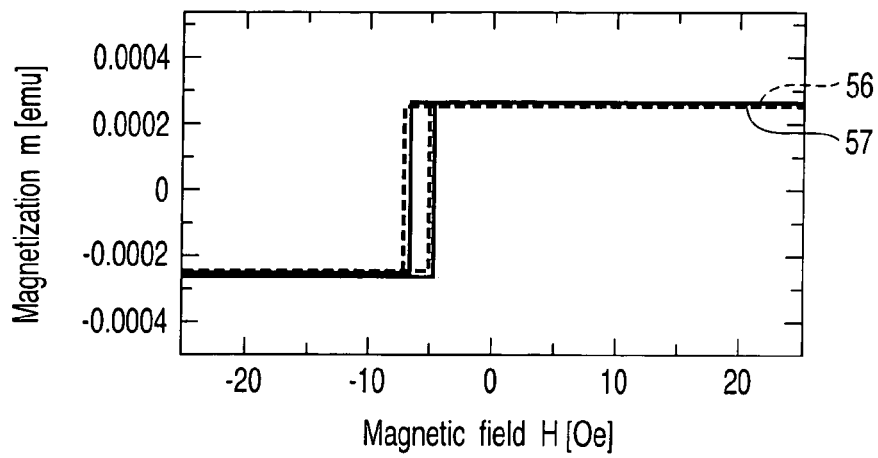
FIG. 23 is a graph of the MH curve close to a magnetic field used for a write operation indicated in FIG. 22.

As is seen from solid line 57 in FIG. 23, the magnetoresistance effect device according to the third modification does not vary greatly in magnetization characteristic even after heat treatment at about 350° C., but keeps the magnetization characteristic and thus improves in heat resistance.

Since a method of manufacturing the magnetoresistance effect device according to the third modification is substantially the same as that in the first embodiment, its detailed descriptions are omitted.

With the above structure, the same advantages as those of the second embodiment can be obtained. Since, moreover, only one diffusion prevention layer (NiFe$_{1-a}$-element X$_a$ layer) 40 is provided between the antiferromagnetic layer 14 and the ferromagnetic layer 31. Therefore, the area of the layers can be prevented from increasing, which is advantageous to microfabrication of the device.

As has been described in detail, according to the embodiments and modifications, there can be provided a magnetoresistance effect device whose magnetic characteristics or output characteristics do not deteriorate even after high-temperature heat treatment at about 350° C. or higher and whose heat resistance is improved, and a method of manufacturing the device. Furthermore, both smoothness and heat resistance are compatible with each other in the device, and the device can be improved in reliability.

The foregoing embodiments and modifications are directed to a 1T1MTJ-type device. However, the present invention can be applied to a cross-point type device and the like. One of the electrode layers 12 and 19 of the MTJ device can be connected to one end of a diode, one end of a current path of a bipolar transistor, another wiring layer, and the like.

In the foregoing embodiments and modifications, the MTJ device is used as an example of the magnetoresistance effect device. However, the present invention is not limited to the MTJ device, but can be applied to a magnetic storage apparatus having another magnetoresistance effect device such as a giant magnetoresistance (GMR) device and a colossal magnetoresistance device. In this case, too, the material of an antiferromagnetic layer can be prevented from diffusing into a nonmagnetic layer (tunnel barrier layer, nonmagnetic metal, and the like), and thus heat resistance can be improved and output characteristics can be prevented from deteriorating.

The step of heat-treating an antiferromagnetic layer and a magnetized fixing layer and segregating an element into a crystal grain boundary of the magnetized fixing layer to prevent the material of the antiferromagnetic layer from diffusing into the crystal grain boundary can be executed after the magnetized fixing layer is formed and before a tunnel barrier layer is formed, after a tunnel barrier layer is formed and before a magnetized free layer is formed, or after a magnetized free layer is formed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetoresistance effect device comprising:
a magnetized free layer formed of a ferromagnetic material, a magnetization of the magnetized free layer being variable;
a magnetized fixing layer formed of a ferromagnetic material and having a crystal grain boundary, a magnetization of the magnetized fixing layer being fixed;
a nonmagnetic layer provided between the magnetized free layer and the magnetized fixing layer; and
an antiferromagnetic layer provided on the opposite side of the magnetized fixing layer from the nonmagnetic layer,
wherein the magnetized fixing layer has an element which is segregated into the crystal grain boundary thereof to prevent a material of the antiferromagnetic layer from diffusing.

2. The magnetoresistance effect device according to claim 1, wherein the element has an atomic radius which is larger than that of a principal element of the magnetized fixing layer.

3. The magnetoresistance effect device according to claim 1, wherein the element is segregated with content a, and the content a falls within a range of $1 \leq a \leq 30$ [at. %].

4. The magnetoresistance effect device according to claim 1, wherein the nonmagnetic layer is a tunnel barrier layer.

5. The magnetoresistance effect device according to claim 1, which operates as a memory cell.

6. A magnetoresistance effect device comprising:
a magnetized free layer formed of a ferromagnetic material, a magnetization of the magnetized free layer being variable;
a synthetic pinned layer, a magnetization of the magnetized pinned layer being pinned;
a first nonmagnetic layer provided between the magnetized free layer and the synthetic pinned layer; and an antiferromagnetic layer provided on the opposite side of the synthetic pinned layer from the first nonmagnetic layer, wherein the synthetic pinned layer includes a first NiFe layer having an element which is segregated into a crystal grain boundary to prevent a material of the antiferromagnetic layer from diffusing.

7. The magnetoresistance effect device according to claim 6, wherein the synthetic pinned layer includes:
a first ferromagnetic layer;
a second ferromagnetic layer; and
a second nonmagnetic layer provided between the first ferromagnetic layer and the second ferromagnetic layer, and
the first NiFe layer is provided between the antiferromagnetic layer and one of the first and second ferromagnetic layers which is provided closer to the antiferromagnetic layer.

8. The magnetoresistance effect device according to claim 7, wherein the synthetic pinned layer includes a third ferromagnetic layer provided between the antiferromagnetic layer and the first NiFe layer.

9. The magnetoresistance effect device according to claim 6, wherein the synthetic pinned layer includes:
a first ferromagnetic layer;
a second ferromagnetic layer;
a second nonmagnetic layer provided between the first ferromagnetic layer and the second ferromagnetic layer,
a second NeFe layer provided between the first nonmagnetic layer and one of the first and second ferromagnetic layers which is provided remoter from the antiferromagnetic layer, the second NeFe layer having an element which is segregated into a crystal grain boundary thereof to prevent a material of the antiferromagnetic layer from diffusing; and
a third ferromagnetic layer provided between the second NiFe layer and the first nonmagnetic layer.

10. The magnetoresistance effect device according to claim 9, wherein the element has an atomic radius which is larger than that of a principal element of each of the first and second NiFe layers.

11. The magnetoresistance effect device according to claim 9, wherein the first and second NiFe layers have a thickness t1, t2 respectively which fall within a range of $0.3 \leq t1, t2 \leq 2$ [nm].

12. The magnetoresistance effect device according to claim 6, wherein the element includes at least one of Ca, Ti, V, Sr, Y, Zr, Nb, Ba, La, Hf and Ta.

13. The magnetoresistance effect device according to claim 6, wherein the element is segregated with content $\underline{a}$, and the content $\underline{a}$ falls within a range of $1 \leq \underline{a} \leq 30$ [at. %].

14. The magnetoresistance effect device according to claim 6, wherein the first nonmagnetic layer is a tunnel barrier layer.

15. The magnetoresistance effect device according to claim 6, which operates as a memory cell.

16. A magnetoresistance effect device comprising:
a magnetized free layer formed of a ferromagnetic material, a magnetization of the magnetized free layer being variable;
a magnetized fixing layer formed of a ferromagnetic material and having a crystal grain boundary, at least one of Ca, Ti, V, Sr, Y, Zr, Nb, Ba, La, Hf and Ta being segregated into the crystal grain boundary;
a nonmagnetic layer provided between the magnetized free layer and the magnetized fixing layer; and
an antiferromagnetic layer provided on the opposite side of the magnetized fixing layer from the nonmagnetic layer.

17. The magnetoresistance effect device according to claim 16, wherein the element is segregated with content $\underline{a}$, and the content $\underline{a}$ falls within a range of $1 \leq \underline{a} \leq 30$ [at. %].

18. The magnetoresistance effect device according to claim 16, wherein the nonmagnetic layer is a tunnel barrier layer.

19. The magnetoresistance effect device according to claim 16, which operates as a memory cell.

20. A method of manufacturing a magnetoresistance effect device, comprising:
forming a antiferromagnetic layer,
forming a first ferromagnetic layer on the antiferromagnetic layer, an element being added to the first ferromagnetic layer to prevent a material of the antiferromagnetic layer from diffusing;
heat-treating the antiferromagnetic layer and the first ferromagnetic layer to segregate the element into a crystal grain boundary in the first ferromagnetic layer;
forming a nonmagnetic layer on the first ferromagnetic layer; and
forming a second ferromagnetic layer on the nonmagnetic layer.

21. The method according to claim 20, wherein the element includes at least one of Ca, Ti, V, Sr, Y, Zr, Nb, Ba, La, Hf and Ta.

22. A method of manufacturing a magnetoresistance effect device, comprising:
forming a first ferromagnetic layer;
forming a nonmagnetic layer on the first ferromagnetic layer;
forming a second ferromagnetic layer on the nonmagnetic layer, an element being added to the second ferromagnetic layer;
forming an antiferromagnetic layer on the second ferromagnetic layer, the element preventing a material of the antiferromagnetic layer from diffusing; and
heat-treating the first ferromagnetic layer, the nonmagnetic layer, the second ferromagnetic layer, and the antiferromagnetic layer to segregate the element into a crystal grain boundary in the second ferromagnetic layer.

23. The method according to claim 22, wherein the element includes at least one of Ca, Ti, V, Sr, Y, Zr, Nb, Ba, La, Hf and Ta.

* * * * *